(12) United States Patent
Lee et al.

(10) Patent No.: US 9,759,939 B2
(45) Date of Patent: Sep. 12, 2017

(54) LIQUID CRYSTAL DISPLAY DEVICE AND FABRICATION METHOD OF A CONDUCTIVE SUBSTRATE

(71) Applicants: INNOCOM TECHNOLOGY (SHENZHEN) CO., LTD., Shenzhen, Guangdong Province (CN); INNOLUX CORPORATION, Chu-Nan, Miao-Li County (TW)

(72) Inventors: Hsin-Yu Lee, Chu-Nan (TW); Ching-Che Yang, Chu-Nan (TW); Ker-Yih Kao, Chu-Nan (TW); Yu-Ju Chen, Chu-Nan (TW)

(73) Assignees: INNOCOM TECHNOLOGY (SHENZHEN) CO., LTD., Shenzhen (CN); INNOLUX CORPORATION, Jhu-Nan (TW)

( * ) Notice: Subject to any disclaimer, the term of this patent is extended or adjusted under 35 U.S.C. 154(b) by 23 days.

(21) Appl. No.: 14/931,275

(22) Filed: Nov. 3, 2015

(65) Prior Publication Data
US 2016/0054617 A1 Feb. 25, 2016

Related U.S. Application Data

(62) Division of application No. 13/727,517, filed on Dec. 26, 2012, now Pat. No. 9,207,505.

(30) Foreign Application Priority Data

Mar. 19, 2012 (TW) .............................. 101109347 A

(51) Int. Cl.
*G02F 1/1333* (2006.01)
*G02F 1/1343* (2006.01)
(Continued)

(52) U.S. Cl.
CPC .... *G02F 1/133345* (2013.01); *G02F 1/13439* (2013.01); *G02F 1/133707* (2013.01); *G02F 1/136286* (2013.01); *H01L 33/42* (2013.01)

(58) Field of Classification Search
CPC .. G02F 1/1333; G02F 1/136; G02F 1/133345; G02F 1/1368; G02F 1/134309;
(Continued)

(56) References Cited

U.S. PATENT DOCUMENTS 6,157,429 A * 12/2000 Miyawaki ......... G02F 1/133526
349/138
2001/0005252 A1* 6/2001 Lee .................. G02F 1/134363
349/141
(Continued)

FOREIGN PATENT DOCUMENTS

| CN | 102236216 | 11/2011 |
| TW | 200745709 | 12/2007 |
| WO | 2011/118085 | 9/2011 |

*Primary Examiner* — Thoi Duong
(74) *Attorney, Agent, or Firm* — Liu & Liu

(57) ABSTRACT

A liquid crystal display device includes: a first substrate; a second substrate spaced apart from the first substrate; and a plurality of liquid crystal molecules disposed between the first and second substrates. The first substrate includes a transparent substrate, an insulator layer formed on a surface of the transparent substrate and formed with a plurality of grooves, and a pixel electrode formed on a surface of the insulator layer and formed with a plurality of electrode slits.

15 Claims, 13 Drawing Sheets

(51) Int. Cl.
 *H01L 33/42* (2010.01)
 *G02F 1/1337* (2006.01)
 *G02F 1/1362* (2006.01)

(58) Field of Classification Search
 CPC ......... G02F 1/136286; G02F 1/133707; G02F
  1/133514; G02F 1/1362; G02F 1/1337;
  G02F 1/134336; G02F 1/1343; G02F
  2001/134372; G02F 2001/133757; G02F
  2201/123; H01L 27/3244; H01L 27/3262;
  H01L 27/3276; H01L 27/326; H01L
  51/5203; H01L 51/5237
 USPC .... 349/43, 138, 143, 106, 139, 42, 141, 178
 See application file for complete search history.

(56) References Cited

U.S. PATENT DOCUMENTS

2011/0299024 A1* 12/2011 Lee ................... G02F 1/134363
  349/144
2013/0001579 A1 1/2013 Jung et al.

* cited by examiner

LIQUID CRYSTAL DISPLAY DEVICE AND FABRICATION METHOD OF A CONDUCTIVE SUBSTRATE

CROSS-REFERENCE TO RELATED APPLICATION

This application is a Divisional of U.S. application Ser. No. 13/727,517, filed on Dec. 26, 2012, which claims priority of Taiwanese Application No. 101109347, filed on Mar. 19, 2012, the entirety of which is incorporated by reference herein.

BACKGROUND OF THE INVENTION

1. Field of the Invention

This invention relates to a liquid crystal device and a method for fabricating a conductive substrate, more particularly to a liquid crystal display device with alleviated dark region problem and a method for fabricating a conductive substrate applied to the liquid crystal display device.

2. Description of the Related Art

A conventional liquid crystal display device comprises: a first substrate having a first conductive layer; a second substrate having a second conductive layer; and a plurality of liquid crystal molecules disposed between the first and second substrates. The first substrate includes thin film transistors (TFTs), and is thus called a TFT side substrate. The second substrate includes a color filter, and is thus called a color filter side substrate. The first substrate includes: a transparent substrate; an insulator layer formed on a surface of the transparent substrate; a plurality of electrically isolated scan lines and data lines formed on the insulator layer; and the first conductive layer made of a transparent conductive material and formed on a surface of the insulator layer. The scan lines and the data lines cooperatively define a plurality of pixel areas. The first conductive layer is formed with a plurality of pixel electrodes that are formed in the pixel areas and that have a plurality of electrode slits. Each of the thin film transistors is electrically connected to the corresponding scan and data lines and the pixel electrodes. Because the structures and configurations of the first and second substrates are well known to a skilled artisan, a detailed description thereof is omitted herein for the sake of brevity.

When an external voltage is applied to the first and second substrates, the thin film transistors can be controlled through the scan and data lines so that the pixel electrodes and the second substrate cooperatively form an electric field, making longitudinal axes of the liquid crystal molecules tilt along a direction perpendicular to lines of electric force so as to generate color variation.

However, since there is no transparent conductive layer at the position of the electrode slits of the pixel electrodes, when an electric field is applied, electric field intensity of the pixel electrode is decreased at positions proximate to the electrode slits, thereby resulting in insufficient tilt for the liquid crystal molecules at the positions of the electrode slits in the pixel area. Therefore, dark regions are likely to be generated.

SUMMARY OF THE INVENTION

Therefore, an object of the present invention is to provide a liquid crystal display device with alleviated dark region problem on a periphery of a pixel area and on the boundaries of different domains.

Another object of the present invention is to provide a method for fabricating a conductive substrate for the liquid crystal display device.

According to one aspect of this invention, a liquid crystal display device comprises: a first substrate; a second substrate spaced apart from the first substrate; and a plurality of liquid crystal molecules disposed between the first and second substrates.

The first substrate include: a transparent substrate, an insulator layer, and a pixel electrode.

The insulator layer is formed on a surface of the transparent substrate and is formed with a plurality of grooves. The pixel electrode is formed on a surface of the insulator layer and is formed with a plurality of electrode slits.

According to another aspect of this invention, a method for fabricating a conductive substrate for a thin film transistor liquid crystal display device comprises the following steps:

(a) preparing a substrate including a transparent substrate, an insulator layer formed on a surface of the transparent substrate, a plurality of spaced apart scan lines arranged in a first direction, and a plurality of spaced apart data lines arranged in a second direction transverse to the first direction, the scan lines being electrically isolated from the data lines, the insulator layer having a peripheral region;

(b) forming a photoresist layer on a surface of the insulator layer, preparing a gray-scale photomask that has a first pattern and a second pattern corresponding in position to a region of the insulator layer that is to be formed into via holes, and a plurality of third patterns corresponding in position to a region of the insulator layer that is to be formed into grooves, the first, second and third patterns having different transmittances, patterning the photoresist layer to remove the photoresist layer at a position corresponding to the first and second patterns until the insulator layer is exposed and parts of the photoresist layer at positions corresponding to the third patterns by photolithography so that the photoresist layer is formed into a mask pattern having different thicknesses;

(c) etching the insulator layer using the mask pattern as an etching mask so that the insulator layer is formed with a plurality of via holes corresponding in position to the first and second patterns, a plurality of spaced-apart grooves corresponding in position to the third patterns, and a plurality of isolated regions for isolating the grooves, the via holes having a depth different from that of the grooves; and (d) forming a conductive layer made of a transparent conductive material on the etched insulator layer, removing a portion of the conductive layer by photolithography so that the conductive layer is formed into a pixel electrode that is formed with a plurality of electrode slits where the conductive layer is removed.

An effect of the present invention resides in that the insulator layer is formed with a plurality of grooves and simultaneously the pixel electrode is formed with a plurality of slits, so that the vertical electric field in the pixel area and the lateral electric field are raised. Accordingly, the orientation of the liquid crystal molecules can be effectively controlled so as to alleviate the dark-line problem of the liquid crystal display device.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENT

Figure 1:
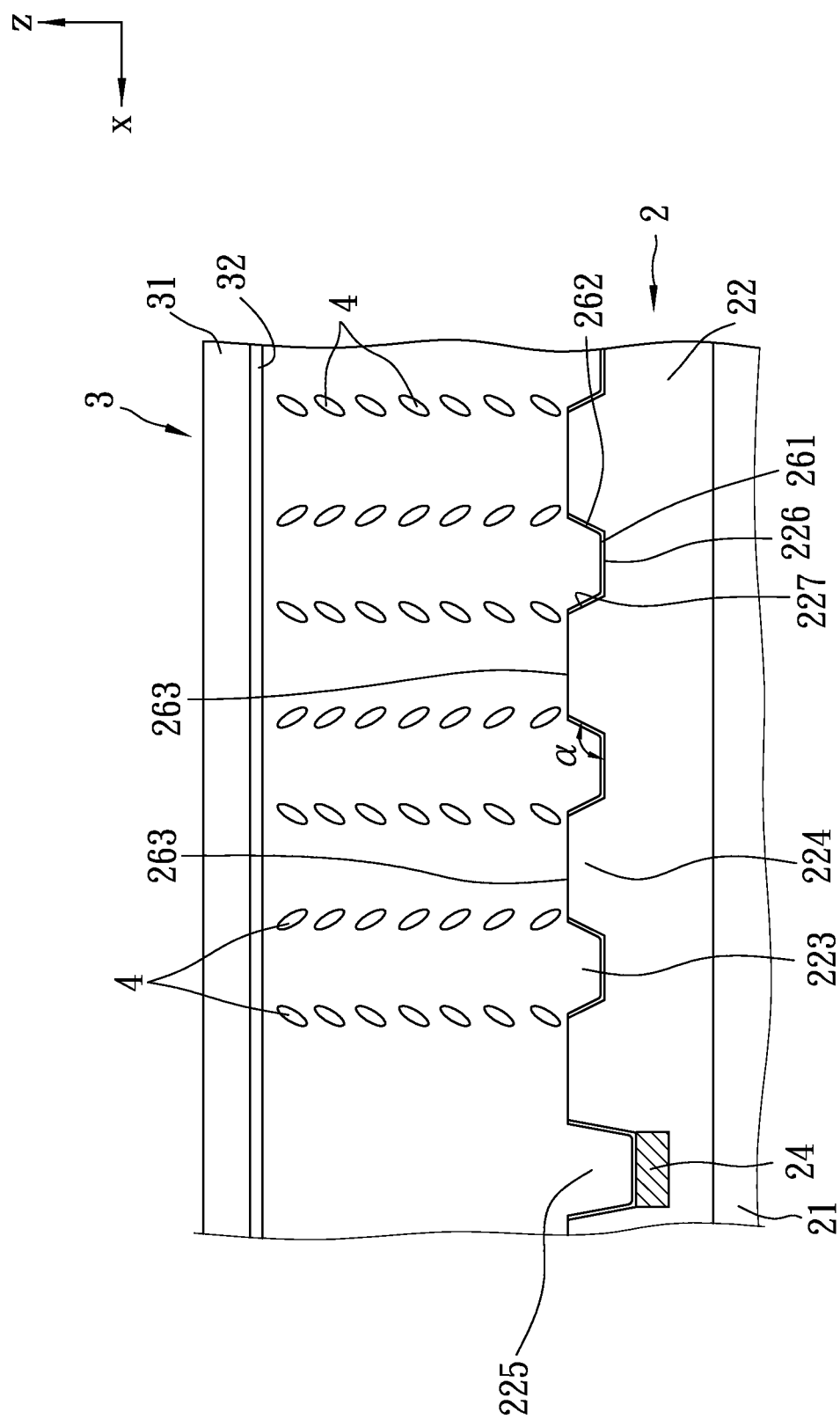
FIG. 1 is a sectional diagram of the preferred embodiment of a liquid crystal display device according to this invention.
Figure 2:
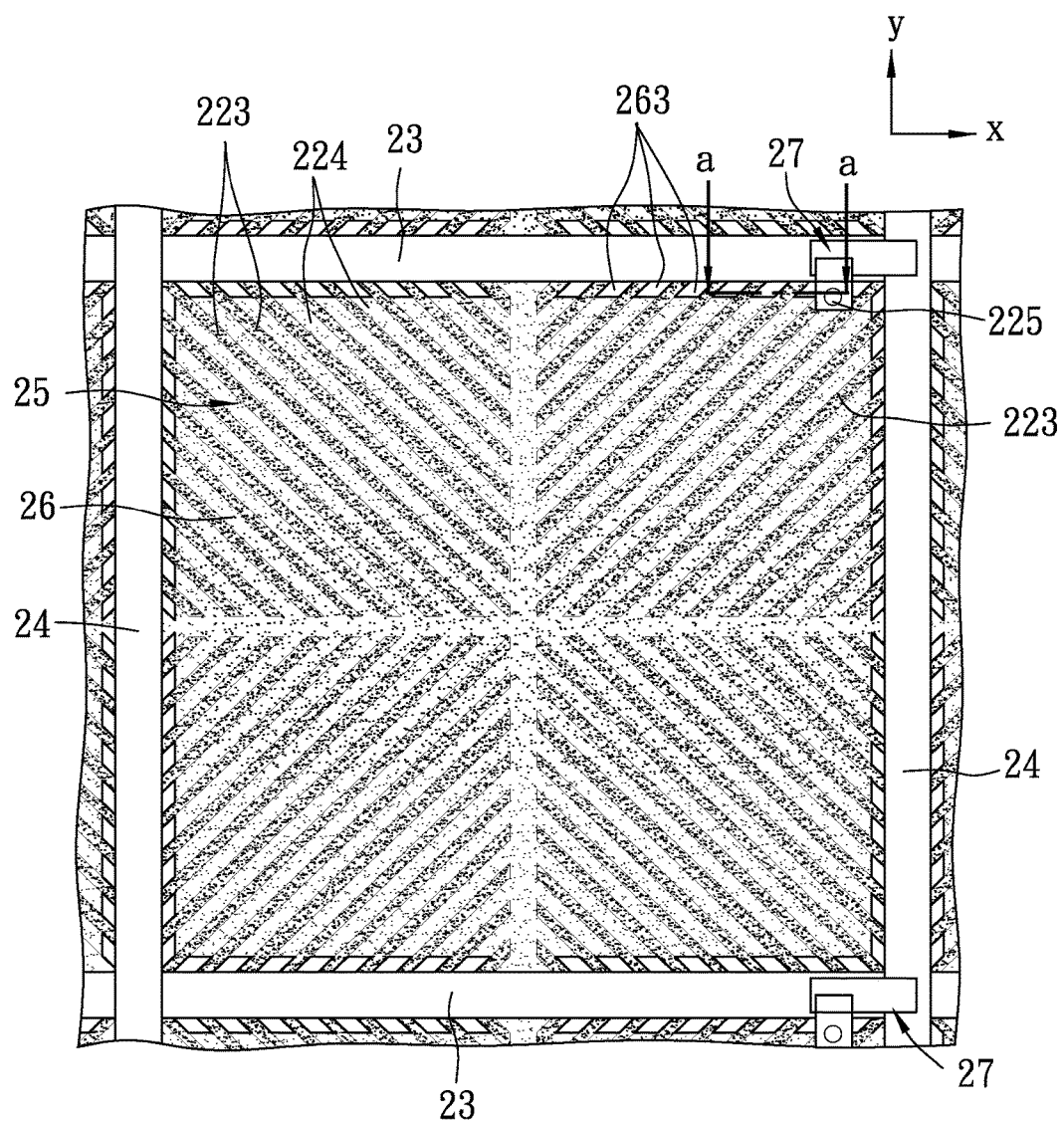
FIG. 2 is a top view of a first substrate of the preferred embodiment.

FIG. 1 is a schematic diagram of the preferred embodiment of a liquid crystal display device of this invention in a state prior to application of an electric field. FIG. 2 is a top view of a first substrate 2 of the preferred embodiment. The first substrate 2 in FIG. 1 is shown as a sectional diagram taken along line a-a in FIG. 2.

It is noted that in FIG. 1 a second direction (x) and a third direction (z) are transversely defined. In FIG. 2 a first direction (y) is defined to be transverse to the second and third directions (x), (z). In this way, the first, second and third directions (y), (x) and (z) are configured as a three-dimensional Cartesian coordinates system.

In the preferred embodiment of this invention, the liquid crystal display device comprises: a first substrate 2; a second substrate 3 that is spaced apart from the first substrate 2 and that forms an electric field with the first substrate 2 when a voltage is applied; and a plurality of liquid crystal molecules 4 that are disposed between the first and second substrates 2 and 3 approximately in the third direction (z) and that are likely to be tilted due to the generated electric field.

The first substrate 2 is a TFT side substrate and includes: a transparent substrate 21; an insulator layer 22; a plurality of scan lines 23; a plurality of data lines 24; a plurality of pixel areas 25; a plurality of pixel electrodes 26; and a plurality of thin film transistors (TFT) 27. Only part of the pixel areas 25 is shown in the figures of this invention.

The transparent substrate 21 is made of a transparent material, such as glass, quartz glass, polyacrylate, polyimide, or other transparent flexible materials. In this embodiment, the transparent substrate 21 is made of glass.

The insulator layer 22 is made of an insulated material and is formed on a surface of the transparent substrate 21.

Referring to FIG. 2, the scan and data lines 23, 24 are respectively arranged along the first direction (y) and the second direction (x) in the insulator layer 22 and are spaced apart from each other. The first and second directions (y) and (x) are mutually transverse and the scan and data lines 23, 24 are electrically isolated. The two adjacent scan lines 23 and the two adjacent data lines 24 cooperatively define a respective one of the pixel areas 25.

Figure 3:
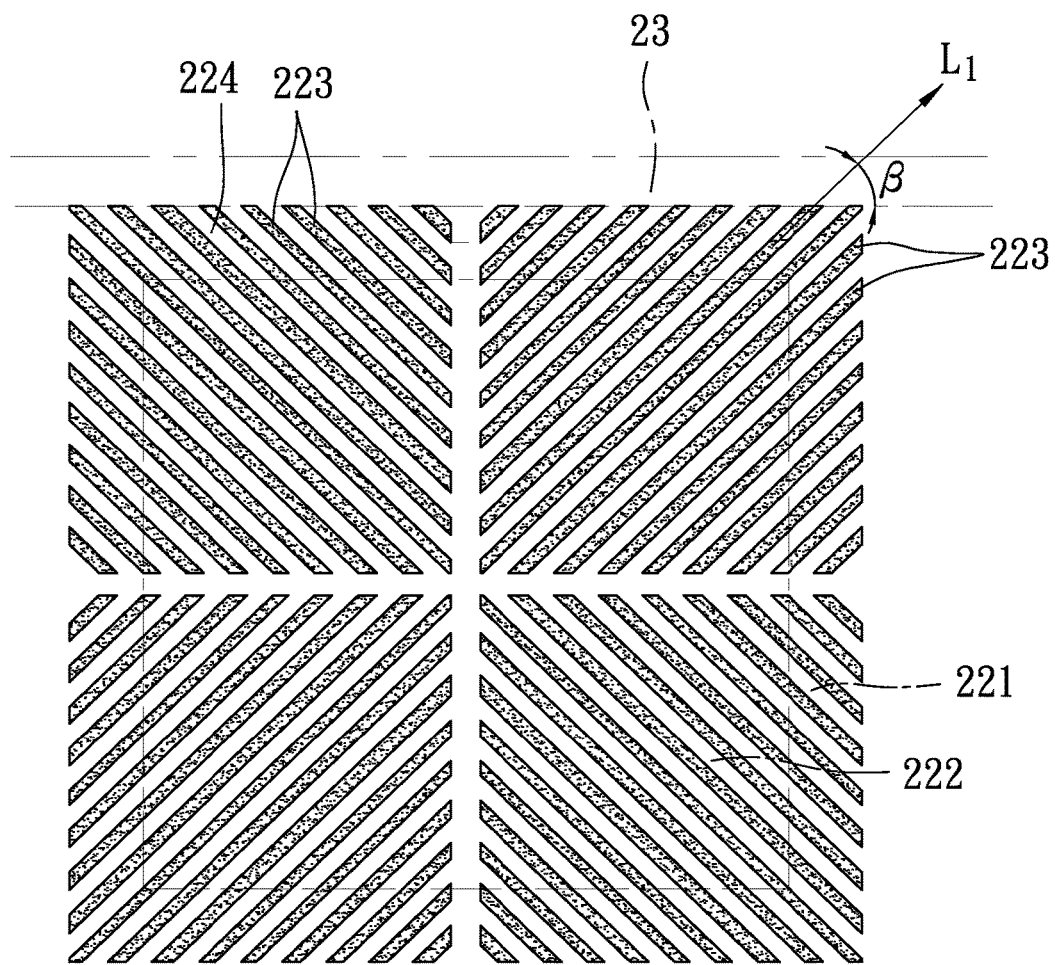
FIG. 3 is a schematic view showing a plurality of grooves in the preferred embodiment.

FIG. 3 is a top view of the insulator layer 22. Referring to FIGS. 1 to 3, the insulator layer 22 has a peripheral region 221, a central region 222 encircled by the peripheral region 221, a plurality of grooves 223 formed downwardly from a surface of the insulator layer 22 toward the substrate 21, a plurality of isolating regions 224 isolating the adjacent grooves 223, and a plurality of via holes 225 (see FIG. 1) for external electrical connection. Each of the grooves 223 has a bottom surface 226 and two lateral surfaces 227 connected to and extending upwardly from two opposite sides of the bottom surface 226.

It is noted that the grooves 223 should be designed to have an appropriate depth since a shallow depth is insufficient for providing adequate confinement for the liquid crystal molecules 4 and since an excessive depth would result in arrangement variation of the liquid crystal molecules 4 near a periphery of each of the grooves 223, thereby causing light leakage problem at the periphery of each of the grooves 223. Preferably, each of the grooves 223 has a depth ranging from 1500 Å to 3000 Å so as to provide adequate confinement and reduce light leakage. Moreover, the bottom surface 226 and each of the lateral surfaces 227 of each of the grooves 223 cooperatively define an angle ($\alpha$). If the angle ($\alpha$) is excessively large, a slow slope is formed such that electric field applied to the grooves 223 is insufficient to confine the liquid crystal molecules 4, thereby resulting in poor arrangement, while a right angle ($\alpha=90°$) results in arrangement variation of the liquid crystal molecules 4 near a periphery of each of the grooves 223, thereby causing light leakage problem at the periphery of each of the grooves 223. Moreover, discontinuity problem between electrode portions formed in the grooves 223 is likely to occur in the pixel electrodes 26. Thus, the angle ($\alpha$) between the bottom surface 226 and each of the lateral surfaces 227 of each of the grooves 223 is preferably larger than 90 degrees and up to 120 degrees.

The grooves 223 extend in a first extending direction (L1) that forms an acute angle ($\beta$) with the scan lines 23. The acute angle ($\beta$) ranges from 35 degrees to 55 degrees. In FIG. 3, the acute angle ($\beta$) is the angle between the first extending direction (L1) and the scan lines 23. Preferably, the acute angle ($\beta$) ranges from 40 degrees to 50 degrees. In this embodiment, the grooves 223 extend from the peripheral region 221 to the central region 222 in mirror symmetrical distribution as shown in FIG. 3, and the acute angle ($\beta$) between the extending direction (L1) of the grooves 223 and the scan lines 23 is 45 degrees. In other embodiments, the grooves 223 can be arranged in asymmetrical distribution depending on actual requirements.

Figure 4:
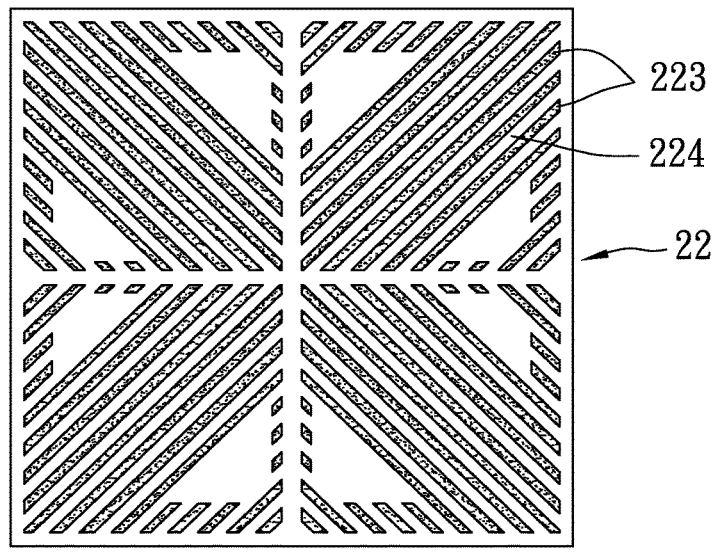
FIG. 4 is a schematic view showing another arrangement of the grooves in the preferred embodiment.
Figure 5:
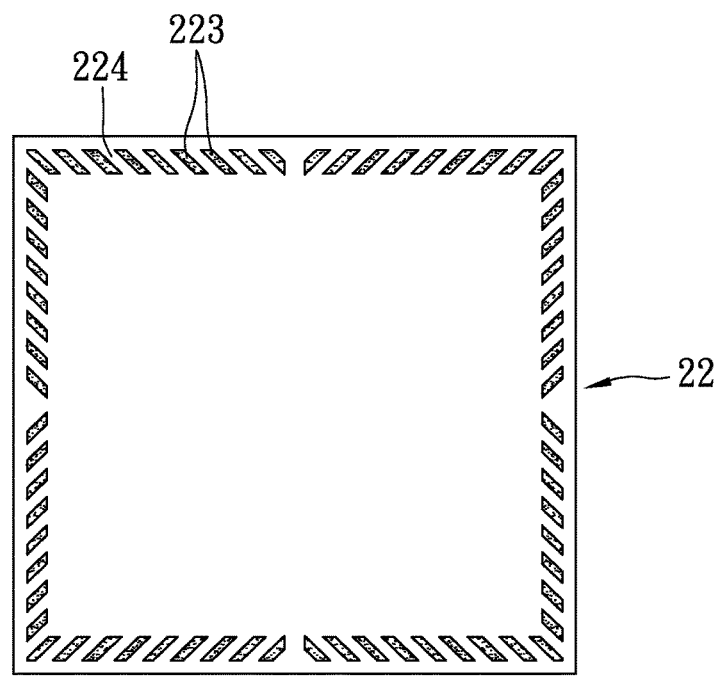
FIG. 5 is a schematic view showing still another arrangement of the grooves in the preferred embodiment.
Figure 6:
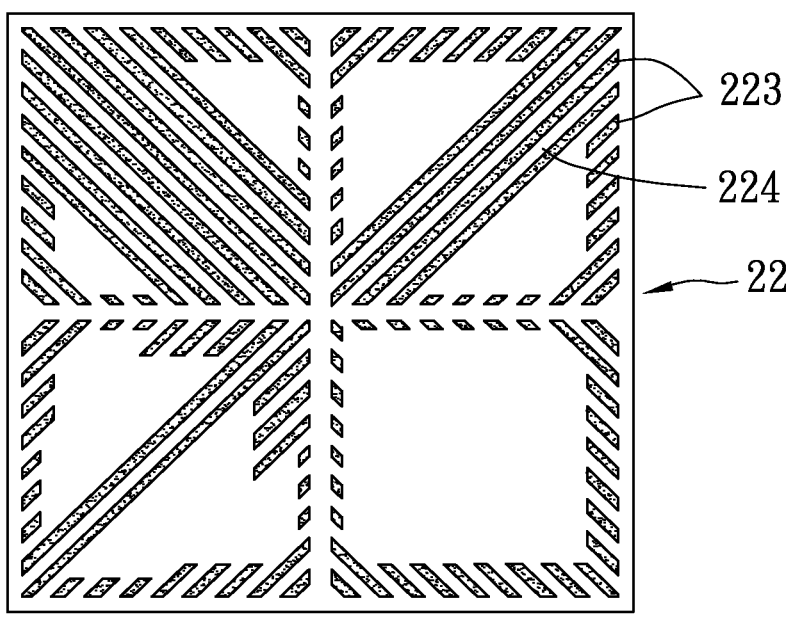
FIG. 6 is a schematic view showing yet another arrangement of the grooves in the preferred embodiment.

Referring to FIGS. 4 to 6, the grooves 223 can also be designed in a pattern as shown in FIG. 4 or 5. That is, some of the grooves 223 formed in the peripheral region 221 extend toward the central region 222 so that some of the grooves 223 are in a continuous pattern (see FIG. 4), or the grooves 223 are only formed in the peripheral region 221 and are spaced apart from each other (see FIG. 5). The grooves 223 can be arranged in an asymmetrical distribution as shown in FIG. 6. Besides, it is further noted that the grooves 223 need not keep a fixed distance from the scan lines 23 as long as the same do not extend beyond the pixel area 25. However, a fixed distance between the channel 223 and the scan lines 23 can be kept if required.

Figure 7:
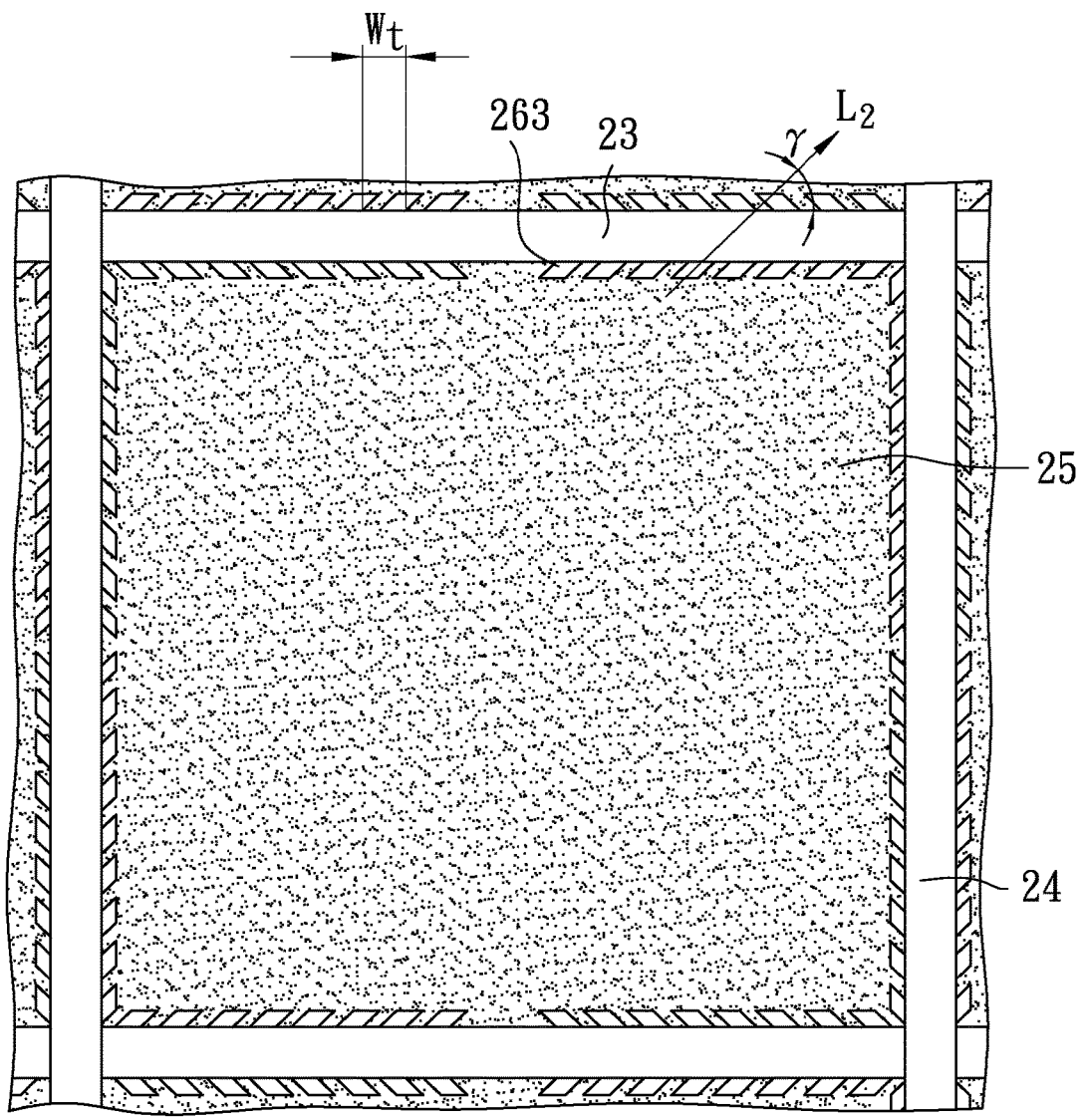
FIG. 7 is a schematic view illustrating a first example of a pixel electrode in the preferred embodiment.

FIG. 7 is a top view of the pixel electrode 26. The pixel electrode 26 is formed in the pixel area 25 and defines a pattern region. Referring to FIGS. 1 and 7, the pixel electrode 26 has a plurality of first electrode portions 261 that are made of a transparent conductive material and that are formed on the bottom surface 226 of each of the grooves 223 (see FIG. 1), a plurality of second electrode portions 262 formed on the lateral surfaces 227, and a plurality of electrode slits 263 formed on top surfaces of the isolating regions 224. The electrode slits 263 can have a geometric shape, such as ellipse, square, rectangular, parallelogram, or trapezoid and can be distributed in an equidistant or a distance-increasing manner.

Preferably, the electrode slits 263 extend in a second extending direction (L2) that forms an acute angle ($\gamma$) with the scan lines 23. Each of the electrode slits 263 has a length along the second extending direction (L2) not shorter than 2 $\mu$m. The acute angle ($\gamma$) ranges from 35 degrees to 55 degrees. Preferably, the acute angle ($\gamma$) ranges from 40 degrees to 50 degrees. Preferably, the difference between the acute angle ($\gamma$) and the acute angle ($\beta$) is within ±5 degree. Moreover, preferably, the sum ($W_t$) of a width of each of the first electrode portions 261 and a width of the adjacent one of the electrode slits 263 ranges from 4 $\mu$m to 8 $\mu$m. The ratio of the width of each of the first electrode portions 261 to the width of the adjacent one of the electrode slits 263 ranges from 0.5 to 2.

In this embodiment, the electrode slits 263 are parallelogram and are formed on top surfaces of the isolating regions 224 in the peripheral region 221. In FIG. 7, each of the electrode slits 263 has one end extending to a periphery of the pixel electrode 26, and the acute angle ($\gamma$) between the extending direction (L2) of the electrode slits 263 and the scan lines 23 is substantially 45 degrees.

Figure 8:
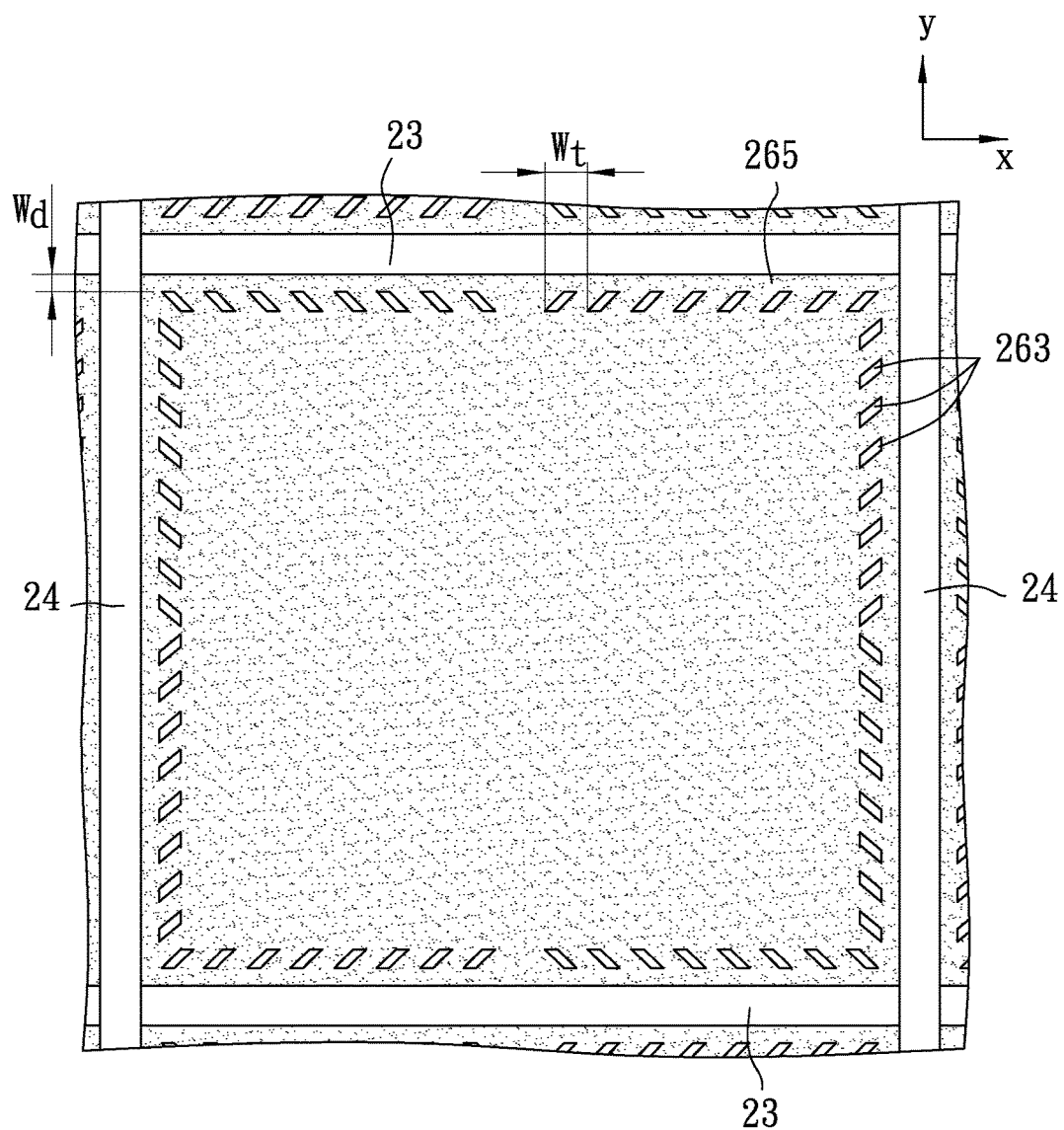
FIG. 8 is a schematic view illustrating a second example of the pixel electrode having a conductive frame portion in the preferred embodiment.

Referring to FIG. 8, the pixel electrode 26 further has a conductive frame portion 265 surrounding the electrode slits 263 and disposed along the periphery of the pixel electrode 26. The end of each of the electrode slits 263 extends to the conductive frame portion 265. Interference in the liquid crystal molecules 4 arising from an electric field generated by the scan and data lines 23, 24 can be reduced by virtue of the conductive frame portion 265, thereby further reducing light leakage problem in dark state and peripheral regions in the pixel area 25. The conductive frame portion 265 has a width ($W_d$) ranging from 0.1 $\mu$m to 5 $\mu$m. More preferably, the conductive frame portion 265 has a width ($W_d$) ranging from 2 $\mu$m to 4 $\mu$m.

Figure 9:
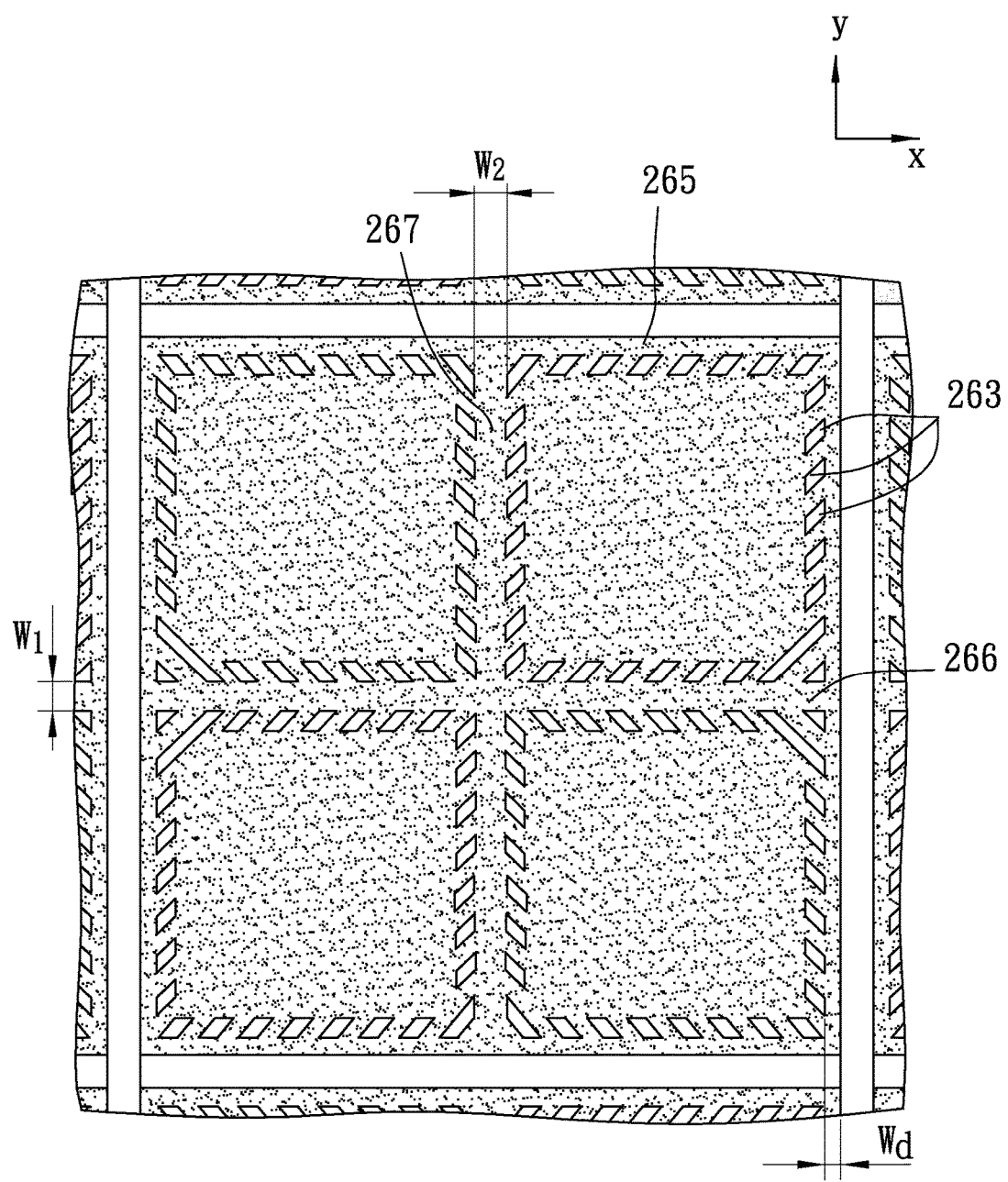
FIG. 9 is a schematic view showing a third example of the pixel electrode with four pattern regions.

Referring to FIG. 9, it is noted that each of the pixel electrodes 26 further has at least one first branch 266 made of a transparent conductive material and extending along the second direction (x) to the conductive frame portion 265, and at least one second branch 267 intersecting the first branch 266 and extending along the first direction (y) to the conductive frame portion 265. In FIG. 9, one first branch 266 and one second branch 267 are used for illustration.

The first and second branches 266, 267, and the conductive frame portion 265 cooperatively define four pattern regions in the pixel electrode 26, so that the pixel electrode 26 has four domains. The electrode slits 263 are distributed in each of the pattern regions along the conductive frame portion 265, and the first and second branches 266, 267. Multi-domain orientation effect can be achieved by forming the pattern regions in the pixel electrode 26. Dark region problem in the periphery of the pixel area 25 can be further alleviated by the formation of the grooves 223, the electrode slits 263, and the first electrode portions 261 in the periphery of each of the pattern regions.

It is noted that the pattern regions are not easy to be defined when the widths of the first and second braches 266, 267 are insufficient, thereby likely resulting in poor arrangement of the liquid crystal molecules 4. However, the dark regions in the pattern regions at the positions corresponding to the first and second branches 266, 267 become obvious when the first and second branches 266, 267 have excessive widths. Preferably, the first and second branches 266 and 267 respectively have widths ($W_1$) and ($W_2$) ranging from 3 $\mu$m to 10 $\mu$m.

Figure 10:
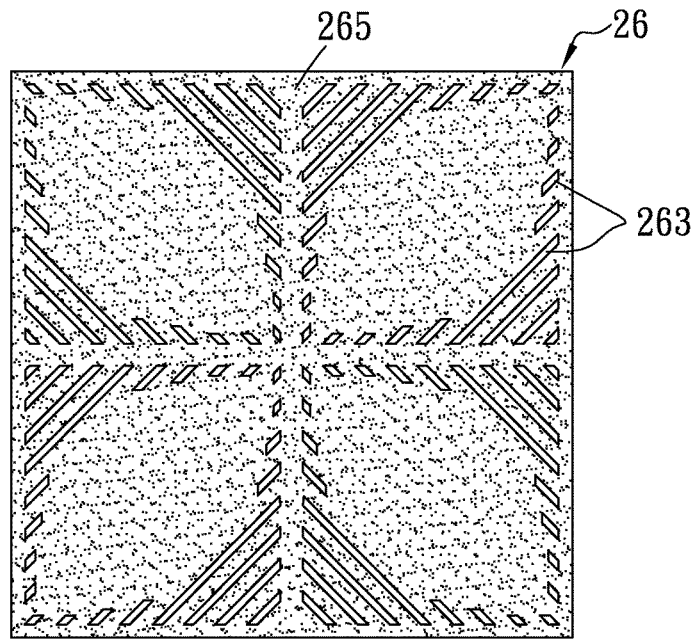
FIG. 10 is a schematic view illustrating a fourth example of the pixel electrode.
Figure 11:
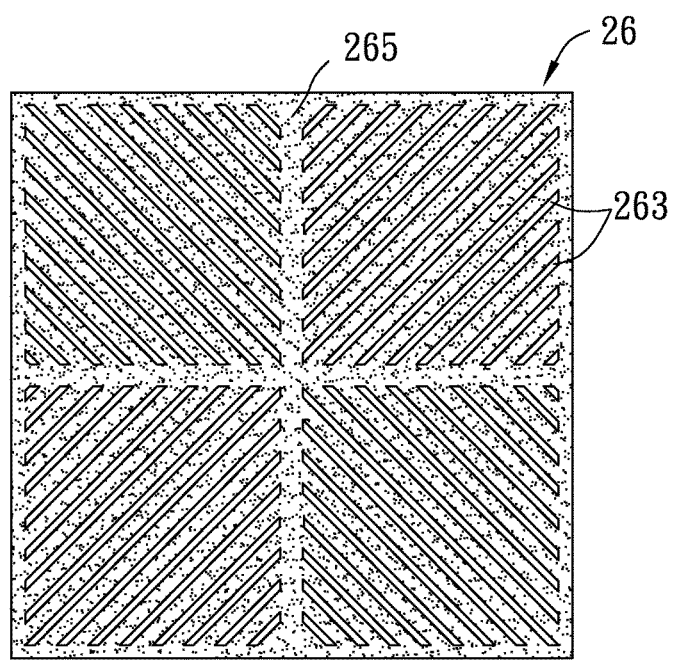
FIG. 11 is a schematic view illustrating a fifth example of the pixel electrode.
Figure 12:
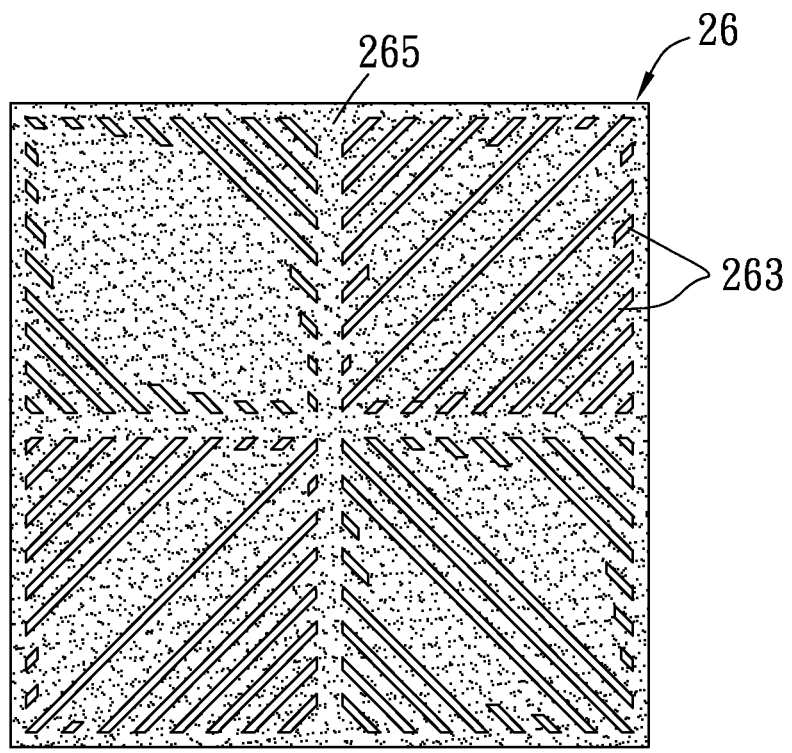
FIG. 12 is a schematic view illustrating a sixth example of the pixel electrode.

Referring to FIGS. 10 to 12, it is further noted that the electrode slits 263 disposed in different pattern regions can also be designed. Parts of the electrode slits 263 disposed on two adjacent lateral sides of each of the pattern regions extend inwardly from the conductive frame portion 265 so as to form certain continuous elongated electrode slits 263 (see FIG. 10), or all of the electrode slits 263 disposed on the two lateral sides of the pattern regions extend inwardly from the conductive frame portion 265 and are formed into a continuous and symmetrical pattern (see FIG. 11). The electrode slits 263 can be formed into an asymmetrical pattern as shown in FIG. 12.

Figure 13:
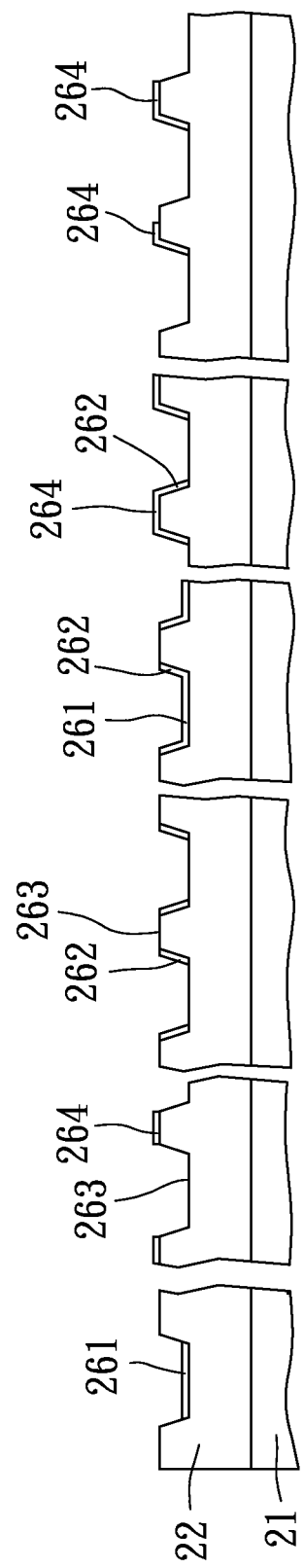
FIG. 13 is a schematic diagram illustrating the distribution of first, second, and third electrode portions.

Referring to FIG. 13, it is noted that the pixel electrodes 26 further have a plurality of third electrode portions 264 formed on a top surface of the isolating regions 224. The first, second, and third electrode portions 261, 262, and 264 can independently exist, simultaneously exist or selectively exist based on actual requirements. The third electrode portions 264 can completely or partially cover the top surface of the isolating regions 224. The electrode slits 263, in conjunction with the distribution pattern of the first, second, and third electrode portions 261, 262, and 264, can be simultaneously or respectively formed on the bottom surface 226 or the lateral surface 227 of each of the grooves 223 or the top surface of each of the isolating regions 224. FIG. 13 is a schematic diagram showing various situations of forming the first, second, and third electrode portions 261, 262, and 264 on the bottom surfaces 226 and the lateral surfaces 227 of the grooves 223 and the isolating regions 224.

The thin film transistors 27 are formed in the pixel areas 25. Each of the thin film transistors 27 is electrically connected to a corresponding one of the scan lines 23, a corresponding one of the data lines 24, and a corresponding one of the pixel electrodes 26.

The second substrate 3 is a color filter side substrate, and has a transparent second base substrate 31 and a transparent conductive layer 32 formed on a surface of the second base substrate 31 proximate to the liquid crystal molecules 4. The liquid crystal molecules 4 are made from a negative dielectric anisotropic liquid crystal material.

When external voltage is applied to the first and second substrates 2, 3, the thin film transistors 27 are controlled through the scan and data lines 23, 24 and the pixel electrodes 26 are thus driven by the external voltage. The pixel electrodes 26 and the transparent conductive layer 32 cooperate to form an electric field therebetween. Accordingly, longitudinal axis of each of the liquid crystal molecules 4 is tilted along a direction perpendicular to lines of electric force so as to generate brightness variation or color variation.

According to this invention, with the structural design of the first substrate 2, i.e., forming a plurality of the grooves 223 in the insulator layer 22, the pixel electrodes 26 can be formed with relatively large conductive areas. Thus, vertical electric field intensity in the grooves 223 in the pixel areas 25 is raised, tilt angle of the liquid crystal molecules 4 in the grooves 223 is increased, and dark region problem in the pixel areas 25 is alleviated. By virtue of the first electrode portion 261 or the second electrode portion 262, lateral electric field generated by the first or second electrode portion 261, 262 first passes the lateral surfaces 227. Accordingly, direction of the electric field passing through the lateral surfaces 227 can vary by adjusting the height and dielectric constant ($\in$) of the grooves 223 so as to reduce interference to the liquid crystal molecules 4, that is caused by electric field at the periphery of the pixel electrode 26, and further alleviate dark region problem in the periphery of the pixel areas 25.

The structure of the aforesaid first substrate 2 in the preferred embodiment of this invention will become more apparent in the following description of a fabricating method thereof.

Figure 14:
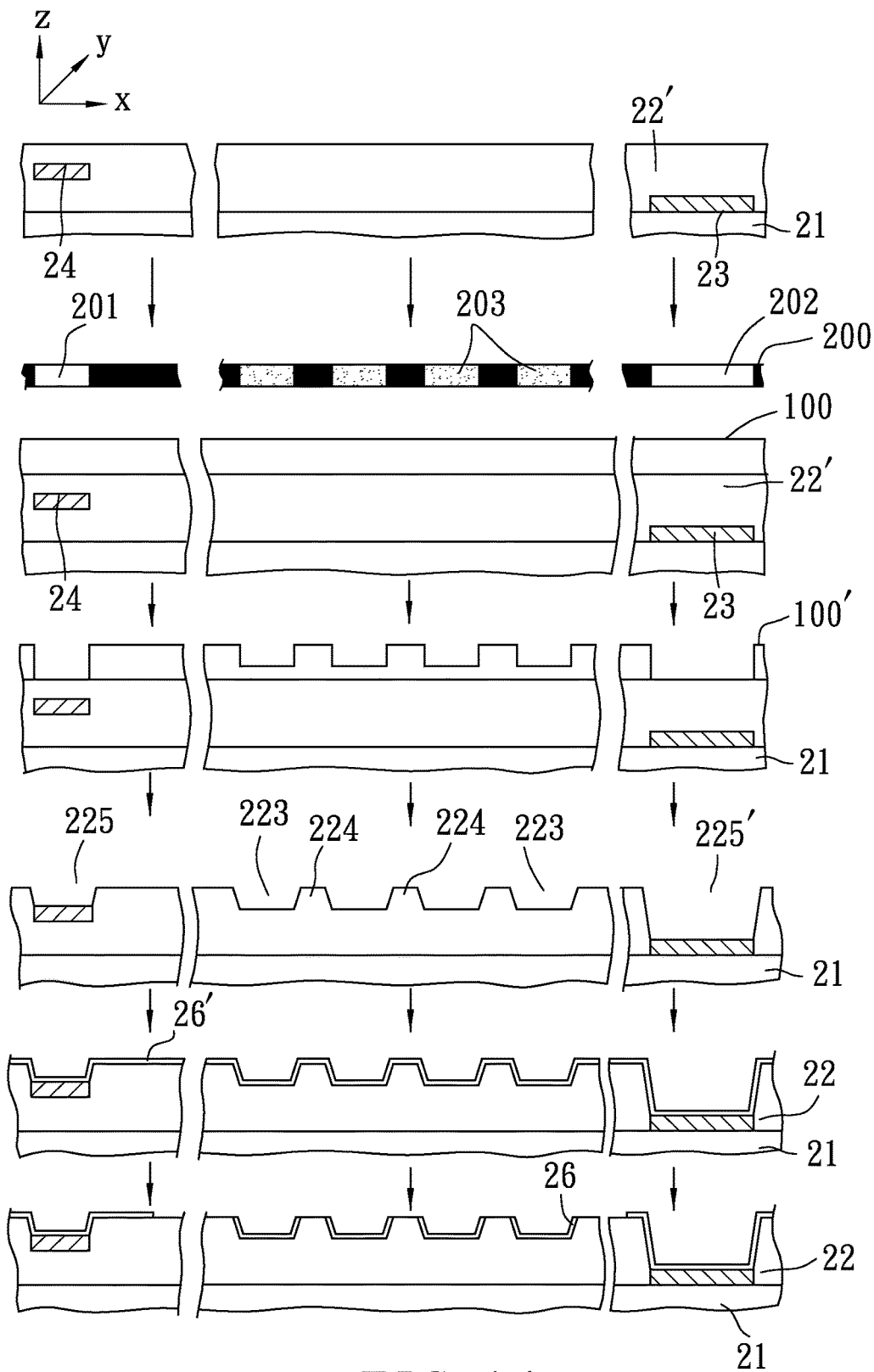
FIG. 14 shows consecutive steps of the preferred embodiment of a method for fabricating the first substrate according to this invention.

Referring to FIG. 14, a method for fabricating the first substrate 2 comprises the following steps.

In step (a), a substrate is provided. The substrate includes a transparent substrate 21, an un-etched insulator layer 22' formed on a surface of the transparent substrate 21, a plurality of spaced apart scan lines 23 arranged in a first direction (y), a plurality of spaced apart data lines 24 arranged in a second direction (x) transverse to the first direction (y), and a plurality of thin film transistors (not shown). The scan lines 23 are electrically isolated from the data lines 24. The un-etched insulator layer 22' has a peripheral region 221 and a central region 222 surrounded by the peripheral region 221.

Since forming processes and materials for the substrate 21, the un-etched insulator layer 22', the scan lines 23, the data lines 24, and the thin film transistors are well known to a skilled artisan and are not critical features of this invention, a detailed description thereof is omitted herein for the sake of brevity.

In step (b), a photoresist layer 100 is formed on a surface of the un-etched insulator layer 22', and a gray-scale photomask 200 is prepared. The gray-scale photomask 200 has a first pattern 201 and a second pattern 202 corresponding in position to a region of the un-etched insulator layer 22' that is to be formed into via holes 225, 225', and a plurality of third patterns 203 corresponding in position to a region of the insulator layer 22 that is to be formed into grooves 223. The first, second and third patterns 201, 202, 203 may have different light transmittances. The photoresist layer 100 is subjected to a photolithography process using the gray-scale photomask 200 to remove the photoresist layer 100 at a position corresponding to the first and second patterns 201, 202 until the un-etched insulator layer 22' is exposed and a portion of the photoresist layer 100 at a position corresponding to the third pattern 203 is removed, so that the photoresist layer 100 is formed into a mask pattern 100' with various thicknesses.

In detail, a photoresist material for the photoresist layer 100 used in step (b) can be a positive or negative photoresist material, and transmittances of the first, second, and third patterns 201, 202, and 203 of the gray-scale photomask 200 should be altered based on the photoresist material. In this embodiment, a positive photoresist is used as the photoresist material for illustration. In this embodiment, the first and second patterns 201, 202 of the gray-scale photomask 200 are completely transparent, the third pattern 203 has transmittance smaller than those of the first and second patterns 201, 202, and the remaining parts are completely light-blocking. After the photoresist layer 100 is subjected to a photolithography process using the gray-scale photomask 200, the photoresist material corresponding in position to the first and second patterns 201 and 202 can be completely removed and the un-etched insulator layer 22' is thus exposed. Since the photoresist material corresponding in position to the third pattern 203 is subjected to relatively low exposure energy, the same would not be completely removed and some of the photoresist material would remain so that the photoresist layer 100 is formed into the mask pattern 100' with various thicknesses.

It is noted that FIG. 14 includes schematic diagrams illustrating consecutive steps for forming the via holes 225, 225' and the grooves 223 in three portions of the insulator layer 22 using the gray-scale photomask 200. The leftmost and rightmost diagrams respectively illustrate a process for forming the via holes 225, 225' in the insulator layer 22 using the first and second patterns 201, 202. The middle diagrams illustrate a process for forming the grooves 223 in the insulator layer 22 using the third patterns 203.

In step (c), the un-etched insulator layer 22' is etched using the mask pattern 100' as an etching mask so that the un-etched insulator layer 22' is formed into a patterned insulator layer 22 formed with a plurality of via holes 225, 225' that correspond in position to the first and second patterns 201, 202 and from which surfaces of the scan and data lines 23, 24 are exposed, a plurality of spaced-apart grooves 223 corresponding in position to the third patterns 203, and a plurality of isolated regions 224 for isolating the grooves 223, thereby forming a semi-product.

In detail, the mask pattern 100' is used as an etching mask in step (c). Dry or wet etching can be used to etch the un-etched insulator layer 22' into patterned insulator layer 22. Since the mask pattern 100' on the insulator layer 22 has various thicknesses and thus has different shielding effects, the via holes 225, 225' and the grooves 223 having different thicknesses can be formed in the patterned insulator layer 22 using a single etching process. In this way, a further photomask process can be eliminated and manufacturing costs can be effectively reduced.

In step (d), a conductive layer 26' made of a transparent conductive material is formed on the patterned insulator layer 22 of the semi-product. A portion of the conductive layer 26' is removed by photolithography so as to form a plurality of electrode slits 263. Therefore, a plurality of pixel electrodes 26 with predetermined patterns can be obtained, thereby obtaining the first substrate 2.

It is noted that the method for fabricating the first substrate 2 further comprises a step (e) after step (d). In step (e), a filler layer 28 made of an insulating material is formed on the patterned insulator layer 22 and the pixel electrode 26.

Figure 15:
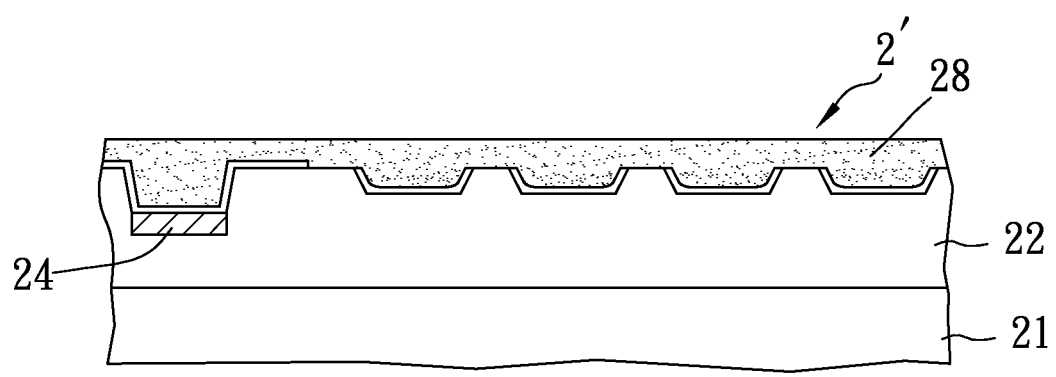
FIG. 15 shows a schematic diagram illustrating the first substrate having a filler layer formed thereon.

In detail, the step (e) is conducted by forming the filler layer 28 made of the insulator material such as silicon nitride, polymer resin, or silicon oxide, on the patterned insulator layer 22 and the pixel electrode 26 using chemical vapor deposition (CVD), sputtering, spin coating, or ink jet printing. In this embodiment, the filler layer 28 is formed on the patterned insulator layer 22 to obtain the first substrate 2' as shown in FIG. 15.

The filler layer 28 formed on a surface of the patterned insulator layer 22 can not only provide a flat surface for subsequent processes, but also reduce light leakage problem in dark state. The light leakage problem is caused by change of orientation direction of the liquid crystal molecules 4 near the lateral surfaces 227 due to slope of the grooves 223. Moreover, direction of the electric field passing through the filler layer 28 can be further adjusted by the thickness and dielectric constant (∈) of the filler layer 28, thereby alleviating dark region problem in the periphery of the pixel areas 25.

According to this invention, the first substrate 2 is designed with the grooves 223 and the electrode slits 263 on the periphery of each of the pixel areas 25 and with the first electrode portions 261 on the bottom surfaces 226 of the grooves 223. By virtue of the structure of the grooves 223, electric field direction in the first electrode portions 261 is modified so as to improve vertical electric field and increase lateral electrical field, thereby effectively alleviating dark region problem in the liquid crystal display device. Moreover, the grooves 223 and the isolating regions 224 of the first substrate 2 are formed using the gray-scale photomask 200 in a single photolithography process rather than two photolithography processes used in the prior art. A photomask required in a second photolithography process can be omitted and manufacturing costs can be further reduced.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A liquid crystal display device, comprising:
a first substrate;
a second substrate spaced apart from the first substrate; and
a plurality of liquid crystal molecules disposed between the first and the second substrates,
wherein the first substrate includes:
a transparent substrate;
an insulator layer formed on a surface of the transparent substrate and formed with a plurality of grooves;
a plurality of scan lines that are disposed on the insulator layer;
a plurality of data lines that are disposed on the insulator layer, that are mutually transverse to the scan lines, and that cooperate with the scan lines to define a plurality of pixel areas; and
a plurality of pixel electrodes formed in the pixel areas on a surface of the insulator layer and each of the pixel electrodes is formed with a plurality of electrode slits,
wherein the plurality of spaced apart scan lines is arranged in a first direction, and the plurality of spaced apart data lines is arranged in a second direction transverse to the first direction, the scan lines being electrically isolated from the data lines, the grooves extending in a first extending direction that forms an acute angle with the scan lines, the acute angle ranging from 35 degrees to 55 degrees.

2. The liquid crystal display device of claim 1, wherein the acute angle ranges from 40 degrees to 50 degrees.

3. The liquid crystal display device of claim 1, wherein the insulator layer has a peripheral region, the grooves being formed in the peripheral region.

4. The liquid crystal display device of claim 3, wherein the insulator layer further has a central region surrounded by the peripheral region, the grooves continuously or discontinuously extending to the central region.

5. The liquid crystal display device of claim 1, wherein each of the pixel electrodes further includes at least one first branch extending along a first direction, and at least one second branch extending along a second direction and intersecting the first branch so as to define the pixel electrode into a plurality of pattern regions.

6. The liquid crystal display device of claim 5, wherein each of the first and second branches has a width ranging from 3 μm to 10 μm.

7. The liquid crystal display device of claim 1, further comprising a filler layer made of an insulated material and filling the grooves.

8. The liquid crystal display device of claim 1, wherein at least two of the electrode slits on two adjacent lateral sides of each of the pixel electrodes are mutually communicated.

9. A liquid crystal display device, comprising:
a first substrate;
a second substrate spaced apart from the first substrate; and
a plurality of liquid crystal molecules disposed between the first and the second substrates,
wherein the first substrate includes:
a transparent substrate;
an insulator layer formed on a surface of the transparent substrate and formed with a plurality of grooves;
a plurality of scan lines that are disposed on the insulator layer;
a plurality of data lines that are disposed on the insulator layer, that are mutually transverse to the scan lines, and that cooperate with the scan lines to define a plurality of pixel areas; and
a plurality of pixel electrodes formed in the pixel areas on a surface of the insulator layer and each of the pixel electrodes is formed with a plurality of electrode slits,
wherein the grooves have a depth from an upper surface of the insulator layer ranging from 1500 Å to 3000 Å, each of the grooves being defined by a bottom surface and two lateral surfaces connected to and extending upwardly from two opposite sides of the bottom surface, the bottom surface and each of the lateral surfaces forming an angle larger than 90 degrees and up to 120 degrees.

10. The liquid crystal display device of claim 9, wherein the insulator layer further has a plurality of isolating regions for isolating the grooves, the pixel electrode defining at least one pattern region and including a plurality of first electrode portions each of which is made of a transparent conductive material and formed on the bottom surface, the electrode slits being formed on a top surface of the isolating regions and one end of each of the electrode slits being proximate to or extending to a periphery of the pattern region.

11. The liquid crystal display device of claim 10, wherein the electrode slits have a parallelogram or trapezoid shape, each of the electrode slits extending in a second extending direction that forms an acute angle (γ) with the scan lines and having a length along the second extending direction not shorter than 2 μm, the acute angle (γ) ranging from 35 degrees to 55 degrees, the ratio of a width of each of the first electrode portions to a width of an adjacent one of the electrode slits ranging from 0.5 to 2.

12. The liquid crystal display device of claim 11, wherein the acute angle (γ) ranges from 40 degrees to 50 degrees.

13. The liquid crystal display device of claim 10, wherein the pixel electrode further includes a plurality of second electrode portions formed on the lateral surfaces.

14. The liquid crystal display device of claim 13, wherein the pixel electrode further includes a plurality of third electrode portions formed on the top surface of the isolating region.

15. A liquid crystal display device, comprising:
a first substrate;
a second substrate spaced apart from the first substrate; and
a plurality of liquid crystal molecules disposed between the first and the second substrates,
wherein the first substrate includes:
  a transparent substrate;
  an insulator layer formed on a surface of the transparent substrate and formed with a plurality of grooves;
  a plurality of scan lines that are disposed on the insulator layer;
  a plurality of data lines that are disposed on the insulator layer, that are mutually transverse to the scan lines, and that cooperate with the scan lines to define a plurality of pixel areas; and
  a plurality of pixel electrodes formed in the pixel areas on a surface of the insulator layer and each of the pixel electrodes is formed with a plurality of electrode slits,
  wherein each of the pixel electrodes further includes a conductive frame portion having a width ranging from 0.1 μm to 5 μm, the conductive frame portion surrounding the electrode slits and being disposed along a periphery of the pixel electrode, each of the electrode slits having one end extending to the conductive frame portion.

* * * * *